(12) United States Patent
Aderhold et al.

(10) Patent No.: US 12,261,047 B2
(45) Date of Patent: Mar. 25, 2025

(54) DOPING TECHNIQUES

(71) Applicant: Applied Materials, Inc., Santa Clara, CA (US)

(72) Inventors: Wolfgang Aderhold, Cupertino, CA (US); Yi-Chiau Huang, Fremont, CA (US); Wei Liu, San Jose, CA (US); Benjamin Colombeau, San Jose, CA (US); Abhilash Mayur, Salinas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 301 days.

(21) Appl. No.: 17/882,177

(22) Filed: Aug. 5, 2022

(65) Prior Publication Data

US 2022/0375753 A1 Nov. 24, 2022

Related U.S. Application Data

(62) Division of application No. 16/536,600, filed on Aug. 9, 2019, now Pat. No. 11,443,948.

(60) Provisional application No. 62/717,827, filed on Aug. 11, 2018.

(51) Int. Cl.
| | |
|---|---|
| *H01L 21/20* | (2006.01) |
| *H01L 21/225* | (2006.01) |
| *H01L 21/324* | (2006.01) |
| *H01L 21/02* | (2006.01) |
| *H10B 41/27* | (2023.01) |
| *H10B 43/27* | (2023.01) |

(52) U.S. Cl.
CPC ........ *H01L 21/2255* (2013.01); *H01L 21/324* (2013.01); *H01L 21/02269* (2013.01); *H10B 41/27* (2023.02); *H10B 43/27* (2023.02)

(58) Field of Classification Search
CPC .............. H01L 21/324; H01L 21/2255; H01L 21/02667; H01L 21/02129; H01L 21/3215
See application file for complete search history.

(56) References Cited

U.S. PATENT DOCUMENTS

| | | | |
|---|---|---|---|
| 4,698,104 A | 10/1987 | Barker et al. | |
| 5,769,963 A * | 6/1998 | Fujioka | H01L 31/206 |
| | | | 136/258 |
| 8,980,719 B2 | 3/2015 | Tsai et al. | |
| 9,202,693 B2 | 12/2015 | Wang et al. | |

(Continued)

FOREIGN PATENT DOCUMENTS

| | | |
|---|---|---|
| JP | H0888394 A | 4/1996 |
| JP | H11150249 A | 6/1999 |

(Continued)

OTHER PUBLICATIONS

"PCT International Search Report and Written Opinion in PCT/US2019/045873 dated Nov. 22, 2019. 11 pages".

*Primary Examiner* — Kyoung Lee
*Assistant Examiner* — David J Goodwin
(74) *Attorney, Agent, or Firm* — Servilla Whitney LLC

(57) ABSTRACT

A method of selectively and conformally doping semiconductor materials is disclosed. Some embodiments utilize a conformal dopant film deposited selectively on semiconductor materials by thermal decomposition. Some embodiments relate to doping non-line of sight surfaces. Some embodiments relate to methods for forming a highly doped crystalline semiconductor layer.

16 Claims, 3 Drawing Sheets

(56) References Cited

U.S. PATENT DOCUMENTS

| | | |
|---|---|---|
| 9,450,100 B2 | 9/2016 | Zhu |
| 9,583,489 B1 | 2/2017 | Anderson et al. |
| 9,899,224 B2 | 2/2018 | Consiglio et al. |
| 2001/0025604 A1 | 10/2001 | Sakai |
| 2005/0026400 A1* | 2/2005 | Todd ................ H01L 21/02667 438/482 |
| 2005/0079692 A1* | 4/2005 | Samoilov ........ H01L 21/823807 438/300 |
| 2011/0269287 A1 | 11/2011 | Tsai et al. |
| 2014/0004689 A1 | 1/2014 | Nainani et al. |
| 2015/0079773 A1 | 3/2015 | Basker et al. |
| 2015/0263091 A1 | 9/2015 | Hashemi et al. |
| 2016/0087070 A1 | 3/2016 | Machkaoutsan et al. |
| 2017/0025509 A1 | 1/2017 | Cheng et al. |
| 2017/0006221 A1 | 3/2017 | Sinclair et al. |
| 2017/0110321 A1 | 4/2017 | Cheng et al. |
| 2017/0352745 A1 | 12/2017 | Kitamura et al. |
| 2018/0061628 A1 | 3/2018 | Ou |
| 2018/0175170 A1 | 6/2018 | Tsai et al. |
| 2018/0301384 A1 | 10/2018 | Ching et al. |
| 2019/0165175 A1* | 5/2019 | More ................ H01L 29/7848 |

FOREIGN PATENT DOCUMENTS

| | | |
|---|---|---|
| JP | 2010153791 A | 7/2010 |
| JP | 2017220526 A | 12/2017 |
| KR | 100612853 B1 | 8/2006 |
| WO | 2016048791 A1 | 3/2016 |

\* cited by examiner

DOPING TECHNIQUES

CROSS-REFERENCE TO RELATED APPLICATIONS

This application is a divisional of U.S. patent application Ser. No. 16/536,600, filed Aug. 9, 2019, which claims priority to U.S. Provisional Application No. 62/717,827, filed Aug. 11, 2018, the entire disclosures of which are hereby incorporated by reference herein.

TECHNICAL FIELD

Embodiments of the present disclosure generally relate to methods of doping semiconductor materials. Some embodiments of the present disclosure relate to methods of selectively doping semiconductor materials relative to oxide materials. Some embodiments of the present disclosure relate to methods for conformally doping semiconductor materials.

BACKGROUND

Controlling boron doping is critical for p-type contact applications. Control of the process requires management of layer thicknesses, surface characteristics, thermal budgets and etch selectivities.

Additionally, existing methods of boron doping do not provide methods of conformally doping three dimensional structures (e.g., FINFETs). These methods (e.g., implantation) are often limited to line of sight or fail to show sufficient conformality.

Further, existing methods of boron doping do not provide methods of doping only semiconductor materials. Current techniques often dope both semiconductor materials as well as neighboring oxide materials.

Accordingly, there is a need for methods of conformally doping semiconductor materials, particularly methods which are selective to semiconductor material surfaces.

SUMMARY

One or more embodiments of the disclosure are directed to a method of forming an electronic device. The method also comprises selectively depositing a substantially conformal dopant film on a first surface comprising a semiconductor material relative to a second surface comprising an oxide material. The electronic device is annealed to drive dopant atoms from the dopant film into the semiconductor material so that the semiconductor material is conformally doped and there is substantially no dopant atoms driven into the oxide material.

Additional embodiments of the disclosure are directed to a method of forming an electronic device. The method comprises providing a substrate with a first surface comprising a semiconductor material and a second surface comprising an oxide material. The first surface and the second surface are exposed to a boron precursor at a temperature in a range of about 700° C. to about 800° C. to selectively deposit a conformal dopant film by a non-line-of-sight, thermal decomposition process. The dopant film is deposited on the first surface over the second surface. The dopant film comprises boron. The electronic device is annealed with a millisecond anneal at a temperature in a range of about 1150° C. to about 1200° C. to drive boron atoms from the dopant film into the semiconductor material so that the semiconductor material is conformally doped and there is substantially no dopant atoms driven into the oxide material.

Further embodiments of the disclosure are directed to a method of forming an electronic device. The method comprises forming an amorphous boron layer on a crystalline semiconductor material. Additional semiconductor material is deposited on the amorphous boron layer. The additional semiconductor material being substantially amorphous. The electronic device is annealed to crystallize the additional semiconductor material to form a boron doped crystalline semiconductor material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
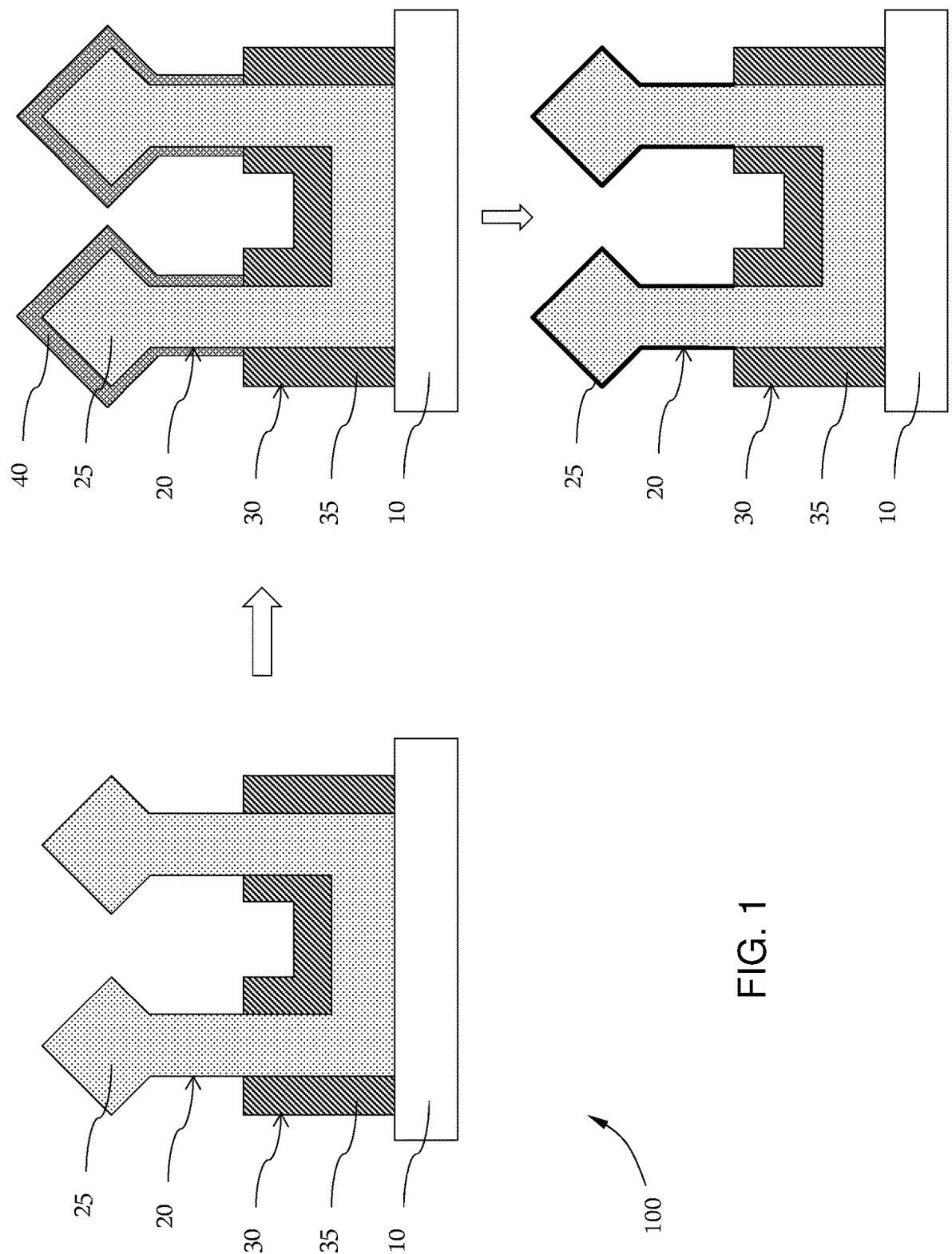
FIG. 1 illustrates an exemplary substrate during processing according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate surface" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to methods of forming an electronic device with a method comprising a conformal and selective doping process. Some embodiments of this disclosure advantageously provide methods of conformally doping a semiconductor material. Some embodiments of this disclosure advantageously provide methods for doping semiconductor materials preferentially over oxide materials. Some embodiments of this disclosure advantageously provide methods of doping non-line of sight surfaces.

As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

Referring to FIG. 1, some embodiments relate to a method 100 of forming an electronic device. FIG. 1 illustrates a cross-sectional view of an exemplary substrate for processing by the method 100. The substrate 10 comprises a first surface 20 comprising a semiconductor material 25 and a second surface 30 comprising an oxide material 35. In some embodiments, the semiconductor material 25 comprises or consists essentially of silicon.

In some embodiments, the semiconductor material 25 is a source/drain extension region of a transistor. In some embodiments, the electronic device comprises a 3D NAND device comprising a plurality of alternating first surfaces 20 and second surfaces 30.

As used in this specification and the appended claims, the term "consists essentially of", and the like, means that the subject film or composition is greater than or equal to about 95%, 98%, 99% or 99.5% of the stated active material. For gaseous compositions (e.g., reactive gases) the term "consists essentially of" refers to the active component of the composition, not including diluent, carrier or inert gases.

In some embodiments, the method 100 begins by selectively depositing a substantially conformal dopant film 40 on the first surface 20 over the second surface 30. As used herein, a film which is "substantially conformal" refers to a film where the thickness is about the same throughout (e.g., on the top, middle and bottom of sidewalls and on the bottom of the gap). A film which is substantially conformal varies in thickness by less than or equal to about 10%, 5%, 2%, 1% or 0.5%.

In some embodiments, the dopant film 40 has a thickness in the range of about 2 to about 10 monolayers.

In some embodiments, selectively depositing the conformal film 40 is performed using a non-line of sight deposition process. Accordingly, in some embodiments, the dopant film 40 deposits conformally on all exposed first surfaces regardless of their "visibility". As shown in FIG. 1, the underside of the diamond fins would typically be difficult to dope as these surfaces are not "visible" to line of sight processes.

In some embodiments, selectively depositing the dopant film 40 comprises a thermal decomposition process. In some embodiments, the thermal decomposition process comprises exposing the first surface and the second surface to a dopant precursor at a temperature in a range of about 600° C. to about 900° C. or in a range of about 700° C. to about 800° C.

In some embodiments, the dopant precursor is a boron precursor and the dopant film comprises boron. In some embodiments, the boron precursor comprises or consists essentially of one or more of borane ($BH_3$), diborane ($B_2H_6$), triborane ($B_3H_5$, $B_3H_7$), tetraborane ($B_4H_6$, $B_4H_{10}$), pentaborane ($B_5H_9$, $B_5H_{11}$) or a cyclic triborane ($B_3H_6$) or a cyclic tetraborane ($B_4H_8$). Additional examples of suitable boron precursors include boron halides such as $BCl_3$, or alkyl substituted boron compounds having the formula BHxR3−x, wherein each R is an independently selected C1-C6 alkyl group and x is 0, 1 or 2. Specific examples of alkyl substituted boron compounds include trimethylboron and triethylboron.

In some embodiments, the dopant precursor is a phosphorous precursor and the dopant film comprises phosphorous. In some embodiments, the phosphorous precursor comprises or consists essentially of phosphine ($PH_3$). In some embodiments, the dopant precursor is an arsenic precursor and the dopant film comprises arsenic. In some embodiments, the arsenic precursor comprises or consists essentially of arsine ($AsH_3$).

In some embodiments, the method 100 continues by annealing the electronic device to drive dopant atoms from the dopant film 40 into the semiconductor material 25 so that the semiconductor material 25 is conformally doped and there is substantially no dopant atoms driven into the oxide material 35. As illustrated in FIG. 1, the conformal doping of the semiconductor material 25 is shown by a bold line on the doped surfaces. As used herein, "substantially no dopant atoms" means that the subject material surface comprises fewer than 5%, 2%, 1%, or 0.5% dopant atoms.

In some embodiments, annealing the electronic device comprises one or more of a spike anneal, laser anneal, rapid thermal anneal, millisecond anneal or a combination thereof. In some embodiments, annealing occurs at a temperature in the range of about 1000° C. to about 1300° C. or in the range of about 1150° C. to about 1200° C.

In some embodiments, the dopant atoms are driven into the semiconductor material 25 to a depth greater than or equal to about 1 nm, greater than or equal to about 2 nm, or greater than or equal to about 5 nm. In some embodiments, the conformally doped semiconductor material has a dopant concentration greater than or equal to about $1^{20}$ atoms B/cm$^3$, greater than or equal to about $2^{20}$ atoms B/cm$^3$, or greater than or equal to about $5^{20}$ atoms B/cm$^3$ at the surface of the semiconductor material.

Figure 2:
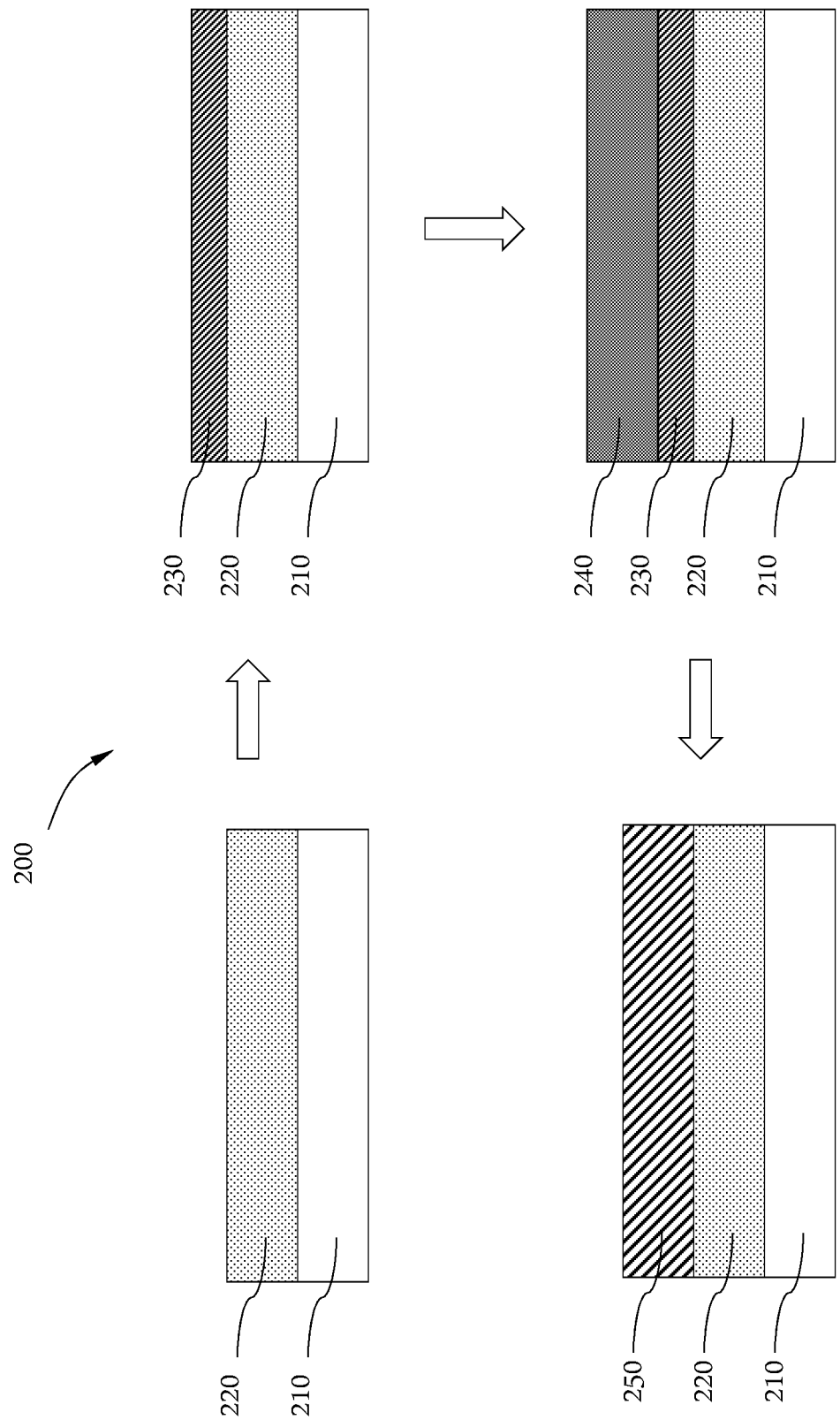
FIG. 2 illustrates an exemplary substrate during processing according to one or more embodiments of the disclosure.

Referring to FIG. 2, some embodiments relate to a method 200 of forming an electronic device. FIG. 2 illustrates a cross-sectional view of an exemplary substrate for processing by the method 200. The substrate 210 comprises a crystalline semiconductor material 220.

In some embodiments, the method 200 begins by forming an amorphous boron layer 230 on the crystalline semiconductor material 220. Forming the amorphous boron layer may be performed by any suitable process, including but not limited to the processes outlined above for depositing a dopant film 40.

In some embodiments, the method 200 continues by depositing additional semiconductor material 240 on the amorphous boron layer 230. In some embodiments, the additional semiconductor material 240 is substantially amorphous.

In some embodiments, the method 200 continues by annealing the substrate 210 to crystallize the additional semiconductor material 240 and melt the amorphous boron layer 230 and form a boron doped crystalline semiconductor material 250. In some embodiments, the anneal process comprises a laser anneal. In some embodiments, the boron doped crystalline semiconductor material 250 has the same stoichiometry as the crystalline semiconductor material 220. In some embodiments, not shown, the method continues by forming a silicide from the boron doped crystalline semiconductor material 250.

In some embodiments, the crystalline semiconductor material 220 and the additional semiconductor material are comprised of the same material. In some embodiments, the semiconductor material comprises silicon. In some embodiments, the semiconductor material comprises silicon and germanium.

Figure 3:
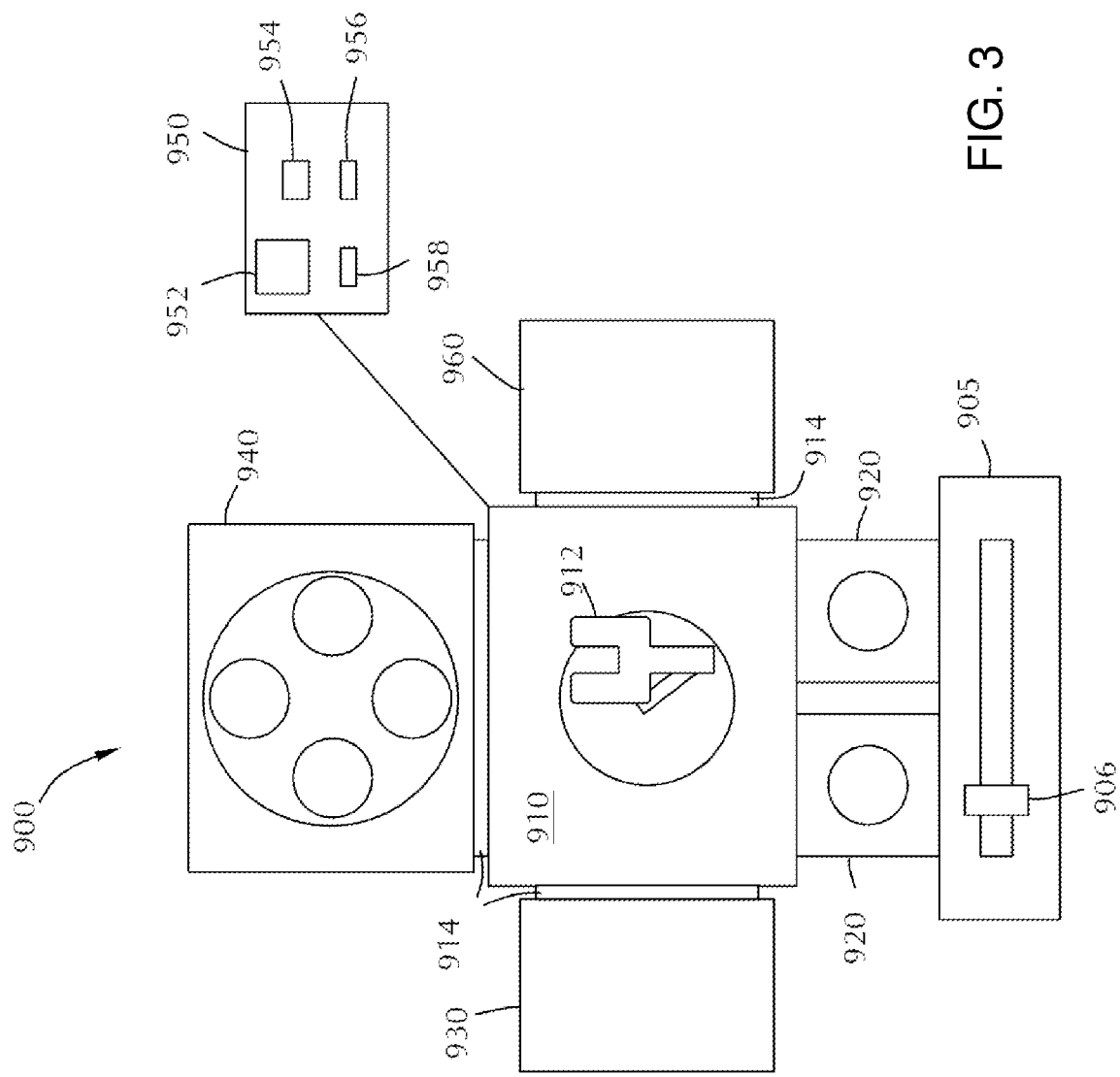
FIG. 3 illustrates a system that can be used to process a substrate according to one or more embodiment of the disclosure.

With reference to FIG. 3, additional embodiments of the disclosure are directed to processing tools 900 for executing the methods described herein. FIG. 3 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 3, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as an anisotropic etching chamber and may be in fluid communication with one or more reactive gas sources to provide one or more flows of reactive gases to the first processing chamber 930. The substrate can be moved to and from the deposition chamber 930 by the robot 912 passing through isolation valve 914.

Processing chamber 940 can also be connected to the central transfer station 910. In some embodiments, processing chamber 940 comprises an isotropic etching chamber and is fluid communication with one or more reactive gas sources to provide flows of reactive gas to the processing chamber 940 to perform the isotropic etch process. The substrate can be moved to and from the deposition chamber 940 by robot 912 passing through isolation valve 914.

Processing chamber 945 can also be connected to the central transfer station 910. In some embodiments, the processing chamber 945 is the same type of processing chamber 940 configured to perform the same process as processing chamber 940. This arrangement might be useful where the process occurring in processing chamber 940 takes much longer than the process in processing chamber 930.

In some embodiments, processing chamber 960 is connected to the central transfer station 910 and is configured to act as a selective epitaxial growth chamber. The processing chamber 960 can be configured to perform one or more different epitaxial growth processes.

In some embodiments, the anisotropic etch process occurs in the same processing chamber as the isotropic etch process. In embodiments of this sort, the processing chamber 930 and processing chamber 960 can be configured to perform the etch processes on two substrates at the same time and processing chamber 940 and processing chamber 945 can be configured to perform the selective epitaxial growth processes.

In some embodiments, each of the processing chambers 930, 940, 945 and 960 are configured to perform different portions of the processing method. For example, processing chamber 930 may be configured to perform the anisotropic etch process, processing chamber 940 may be configured to perform the isotropic etch process, processing chamber 945 may be configured as a metrology station or to perform a first selective epitaxial growth process and processing chamber 960 may be configured to perform a second epitaxial growth process. The skilled artisan will recognize that the number and arrangement of individual processing chamber on the tool can be varied and that the embodiment illustrated in FIG. 3 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, 945, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and subprocessors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to deposit a dopant film; a configuration to anneal the substrate; and a configuration to deposit semiconductor material.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming an electronic device, the method comprising:
    forming an amorphous boron dopant layer on a crystalline semiconductor material;
    depositing additional semiconductor material on the amorphous boron dopant layer, the additional semiconductor material being substantially amorphous; and
    annealing the electronic device at a temperature in the range of about 1000° C. to about 1300° C. to crystallize the additional semiconductor material and to melt the amorphous boron dopant layer to drive the boron from dopant layer into the additional semiconductor material to a depth greater than or equal to about 1 nm form a boron-doped crystalline semiconductor material.

2. The method of claim 1, wherein the crystalline semiconductor material comprises silicon.

3. The method of claim 2, wherein the crystalline semiconductor material further comprises germanium.

4. The method of claim 3, wherein annealing the electronic device comprises a laser anneal.

5. The method of claim 4, wherein the boron-doped crystalline semiconductor material has a dopant concentration greater than or equal to $1^{20}$ atoms B/cm$^3$.

6. The method of claim 5, wherein forming the amorphous boron dopant layer comprises exposing the crystalline semiconductor material to a boron precursor comprising one or more of borane, diborane, triborane, tetraborane or pentaborane.

7. The method of claim 6, wherein the boron precursor comprises one or more of a cyclic triborane, or a cyclic tetraborane.

8. The method of claim 6, wherein the boron precursor comprises a haloborane.

9. The method of claim 6, wherein the boron precursor comprises an alkyl borane.

10. The method of claim 5, wherein the boron-doped crystalline semiconductor material has a dopant concentration greater than or equal to $2^{20}$ atoms B/cm$^3$.

11. The method of claim 5, wherein the boron-doped crystalline semiconductor material has a dopant concentration greater than or equal to $5^{20}$ atoms B/cm$^3$.

12. The method of claim 1, wherein the amorphous boron dopant layer has a thickness in a range of about 2 to about 10 monolayers.

13. The method of claim 1, wherein annealing the electronic device occurs at a temperature in the range of about 1150° C. to about 1200° C.

14. The method of claim 1, wherein the crystalline semiconductor material is a source/drain extension region of a transistor.

15. The method of claim 4, wherein the annealing the electronic device comprises a millisecond laser anneal.

16. The method of claim 15, wherein the boron-doped crystalline semiconductor material has a dopant concentration greater than or equal to $5^{20}$ atoms B/cm$^3$.

* * * * *